(12) United States Patent
Sofer et al.

(10) Patent No.: US 9,503,088 B2
(45) Date of Patent: Nov. 22, 2016

(54) METHOD AND CONTROL DEVICE FOR RECOVERING NBTI/PBTI RELATED PARAMETER DEGRADATION IN MOSFET DEVICES

(71) Applicants: Sergey Sofer, Rishon Lezion (IL); Michael Priel, Netanya (IL); Noam Sivan, Ganey Tikva (IL)

(72) Inventors: Sergey Sofer, Rishon Lezion (IL); Michael Priel, Netanya (IL); Noam Sivan, Ganey Tikva (IL)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/655,150

(22) PCT Filed: Jan. 10, 2013

(86) PCT No.: PCT/IB2013/050225
§ 371 (c)(1),
(2) Date: Jun. 24, 2015

(87) PCT Pub. No.: WO2014/108751
PCT Pub. Date: Jul. 17, 2014

(65) Prior Publication Data
US 2015/0333754 A1    Nov. 19, 2015

(51) Int. Cl.
*H03K 19/003*    (2006.01)
*H03K 19/0944*    (2006.01)

(52) U.S. Cl.
CPC .... *H03K 19/00384* (2013.01); *H03K 19/0944* (2013.01)

(58) Field of Classification Search
CPC ............. H03K 17/284; H03K 17/302; H03K 18/00384
See application file for complete search history.

(56) References Cited

U.S. PATENT DOCUMENTS

| | | | |
|---|---|---|---|
| 8,570,068 B2 * | 10/2013 | Chern | H03K 19/0016 326/83 |
| 8,786,307 B2 * | 7/2014 | Jain | H03K 19/00315 326/9 |
| 2010/0176870 A1 | 7/2010 | Kohamada | |
| 2010/0253406 A1 | 10/2010 | Seefeldt et al. | |
| 2010/0318313 A1 | 12/2010 | Agarwal et al. | |
| 2011/0199140 A1 | 8/2011 | Shimogawa et al. | |
| 2012/0159276 A1 | 6/2012 | Zandian et al. | |

FOREIGN PATENT DOCUMENTS

JP    2006054499    6/2006

OTHER PUBLICATIONS

International Search Report and Written Opinion correlating to PCT/IB2013/050225 issued on Aug. 27, 2013.

(Continued)

*Primary Examiner* — Jeffrey Zweizig

(57) ABSTRACT

The invention provides a method for recovering NBTI/PBTI related parameter degradation in MOSFET devices. The method includes operating the at least one MOSFET device in a standby mode, exiting the at least one MOSFET device from the standby mode, holding the at least one MOSFET device in an active state for a predetermined time span after exiting the standby mode, and operating the at least one MOSFET device in an operational mode after the predetermined time span has elapsed.

16 Claims, 1 Drawing Sheet

(56) References Cited

OTHER PUBLICATIONS

S.V.Kumar, C.H.Kim, S.S.Sapatnekar, "NBTI—Aware Synthesis of Digital Circuits", Proceedings of the IEEE/ACM Design Automation Conference, Jun. 2007.

Yang, J. et al., "A novel empirical model for NBTI recovery with the modulated measurement time frame", 13th International Symposium on the Physical and Failure Analysis of Integrated Circuits, Jul. 3-7, 2006, pp. 33-36.

* cited by examiner

METHOD AND CONTROL DEVICE FOR RECOVERING NBTI/PBTI RELATED PARAMETER DEGRADATION IN MOSFET DEVICES

FIELD OF THE INVENTION

This invention relates to a method for recovering NBTI/PBTI related parameter degradation in MOSFET devices. The invention also relates to a control device configured to recover NBTI/PBTI related parameter degradation in MOSFET devices.

BACKGROUND OF THE INVENTION

Metal oxide semiconductor field-effect transistor (MOSFET) devices in very-large-scale integrated (VLSI) devices exhibit performance degradation when under continued influence of negative or positive bias temperature instability (NBTI/PBTI). NBTI occurs when a gate-to-source (GSS) voltage of a p-channel MOSFET device is kept at a negative supply voltage level at elevated temperatures for a prolonged period of time, often referred to as stress phase. On the other hand, PBTI occurs when n-channel MOSFET devices are positively biased at elevated temperatures for a prolonged period of time. NBTI may also occur in n-channel MOSFET devices when being negatively biased in the accumulation regime. Although both effects can be recovered to a certain degree, over the lifetime of a MOSFET device the NBTI effect prove to be more detrimental since vital MOSFET parameters such as the threshold voltage or the transconductance. The degradation of the parameters usually exhibits a logarithmic dependency on time.

Several approaches have been taken in the prior art to combat NBTI/PBTI related degradation of FET device parameters in order to improve the functionality of integrated circuitry employing such devices.

Ricketts, A. et al.: "Investigating the impact of NBTI on different power saving cache strategies", Design, Automation & Test in Europe Conference & Exhibition (DATE), March 2010, pages 592-597, disclose power saving strategies for SRAM cells with respect to NBTI induced parameter degradation.

Li, L. et al.: "Proactive NBTI mitigation for busy functional units in out-of-order microprocessors", Design, Automation & Test in Europe Conference & Exhibition (DATE), March 2010, pages 411-416, disclose proactive NBTI recovery schemes for functional units in microprocessors.

Shin, J. et al.: "A Proactive Wearout Recovery Approach for Exploiting Microarchitectural Redundancy to Extend Cache SRAM Lifetime", ISCA '08 Proceedings of the 35th Annual International Symposium on Computer Architecture, pages 353-362, disclose proactive NBTI recovery scheduling of FET devices of microarchitecturally redundant functional units.

The document U.S. Pat. No. 8,063,655 B2 discloses a method for reducing NBTI degradation of MOSFET devices, including forward biasing the MOSFET device when a shift in threshold voltage exceeds a predetermined value.

The document US 2012/0159276 A1 discloses an automated guardband compensation system for compensating for degradation in the guardband of clocked data processing circuits within a data processing system.

Yang, J. B. et al.: "A novel empirical model for NBTI recovery with the modulated measurement time frame", Proceedings of the 13th IPFA 2006, Singapore, page 33, describes the empirical model of the NBTI recovery with respect to the influence of the measurement associated with the removal of stress in comparison to the long-term ageing stress.

Kumar, S. V. et al.: "NBTI-Aware Synthesis of Digital Circuits", Proceedings of the IEEE/ACM Design Automation Conference, June 2007, disclose calculating cell delay based on the switching probability and adjusting duty cycles of switching circuits with respect to a NBTI model.

There is a need for solutions that allow MOSFET devices to recover from any temporary NBTI/PBTI induced degradation of device parameters upon entering an operational state when exiting a NBTI/PBTI stress phase.

SUMMARY OF THE INVENTION

The present invention provides a method for recovering NBTI/PBTI related parameter degradation in MOSFET devices, a control device configured to recover NBTI/PBTI related parameter degradation in MOSFET devices and an integrated circuit comprising such a control device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
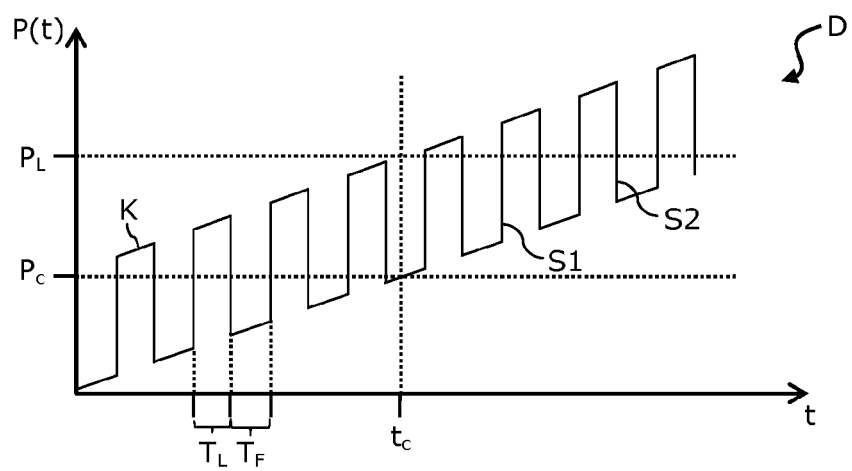
FIG. 1 schematically shows an diagram of an example of of the evolution of a functional parameter of a MOSFET device over time.

In a first example, a method for recovering NBTI/PBTI related parameter degradation in MOSFET devices comprises operating the at least one MOSFET device in a standby mode, exiting the at least one MOSFET device from the standby mode, holding the at least one MOSFET device in an active state for a predetermined time span after exiting the standby mode, and operating the at least one MOSFET device in an operational mode after the predetermined time span has elapsed.

In a second example, a control device for recovering NBTI/PBTI related parameter degradation in MOSFET devices comprises an output configured to be operably connected to the at least one MOSFET device, a driver module coupled to the output and configured to provide a gate driver signal to the gate of the at least one MOSFET device, a control module coupled to the driver module and configured to input a gate control signal for the at least one MOSFET device to the driver module, an input configured to receive an operation activation signal for the at least one MOSFET device, and a timing module coupled to the input, the control module and the driver module, the timing module being configured to receive the operation activation signal, to output a first activation signal to the driver module causing the driver module to hold the at least one MOSFET device in an active state for a predetermined time span after receiving the first activation signal, and to output a second activation signal to the control module causing the control module to generate gate control signals according to an operational mode of the at least one MOSFET device after the predetermined time span has elapsed.

Further, in a third example, an integrated circuit comprises a control device according to the second example, and at least one MOSFET device operably connected to the output of the control device.

It is suggested to provide for a procedure which allows for NBTI/PBTI induced temporary parameter degradation in a MOSFET device to subside when the MOSFET device is to be switched from an inactive state to an active state. The inactive state may be any state where a voltage from gate to drain or gate to source of the MOSFET device is being permanently applied to the MOSFET device, i.e. when the MOSFET device has been under stress for a prolonged period of time.

The procedure involves a guarding time span to be introduced between exiting the inactive state during which at least a partial recovery of the reversible effects of NBTI or PBTI may be achieved for the MOSFET device, before it is put into its normal operational mode, i.e. a mode in which the MOSFET device is toggled according to its intended function within an integrated circuit.

This guarding time span may be regarded as some sort of "warm-up" period during which NBTI/PBTI influenced parameters of the MOSFET device, such as the voltage threshold or the transconductance of the MOSFET device, may be recovered. The recovery of the NBTI/PBTI influenced parameters usually exhibits an exponential behaviour so that the guarding time span may be chosen according to the desired level of recovery.

FIG. 1 shows an diagram of an example of D of the evolution of a functional parameter P(t) of a MOSFET device over time t. The functional parameter P(t) may for example be the threshold voltage Vt of a MOSFET device. An example of the course of the functional parameter P(t) is denoted by the curve K. Generally, the MOSFET device may be alternating between a standby mode (or low power mode, energy saving mode, dormant mode, inactive mode) having a typical duration of $T_L$, and a functional mode (or active mode, fully operational mode) having a typical duration of $T_F$. Over the course of time, there will be an underlying increase in the functional parameter P(t) due to NBTI/PBTI effects that cannot be recovered. After a certain period of time $t_c$, for example several years of operation of the MOSFET device, this unrecoverable degradation of the functional parameter P(t) will increase the functional parameter P(t) to a level of $P_c$.

Whenever the MOSFET device is in the standby mode, however, there is an additional contribution of increase in the functional parameter P(t) amounting to a value of $P_L-P_c$. This contribution only occurs during the standby mode or shortly after exiting the standby mode. The onset S1 of the recoverable degradation has an upward slope of about 1 ms$^{-1}$. On the other hand, the decline S2 of the recoverable of the degradation after exiting the standby mode has a downward slope of about $10^{-8}$ s$^{-1}$, which decline is by orders of magnitude faster than the build-up of the degradation.

Summarizing the above, there is a significant level of contribution from recoverable degradation of a MOSFET device associated with NBTI/PBTI stress that can be recovered as soon as the stress or bias causing the degradation is removed from the MOSFET device. If upon exiting the standby mode the degradation is allowed to be recovered during a certain time span before the MOSFET device is actually returning to its normal, i.e. intended operationally active mode, the functional parameters P(t) of the MOSFET device may at least partially be recovered resulting in better performance of the MOSFET device. In turn, this may advantageously allow for a decrease of margins having to be taken into account for the functional parameters P(t) in the design phase. Additionally, such measures may lead to a decrease of failure probability of MOSFET devices in the field. Finally, substrate area for implementing the MOSFET devices may be advantageously reduced and critical timing paths may be closed more easily. Also, the power consumption of the MOSFET devices may be reduced.

Figure 2:
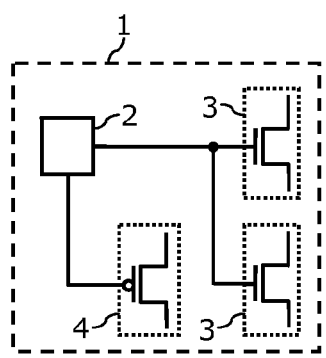
FIG. 2 schematically shows an example of an embodiment of an integrated circuit comprising a MOSFET device and a control device.

FIG. 2 schematically illustrates an integrated circuit 1 comprising a plurality of MOSFET devices 3 and 4 having their gate terminals operably coupled to one or more outputs of a control device 2 arranged essentially on the same substrate as the MOSFET devices 3 and 4. The MOSFET devices in the example of FIG. 2 comprise two n-channel MOSFET devices 3 and one p-channel MOSFET device 4. However, as should be obvious to the skilled person in the art, the number, arrangement and interconnection of the MOSFET devices 3 and 4 as well as their distribution over p- or n-channel types is not limited to the example in FIG. 2. It may well be possible to provide more or less than the number of MOSFET devices 3 and 4 shown in FIG. 2.

Figure 3:
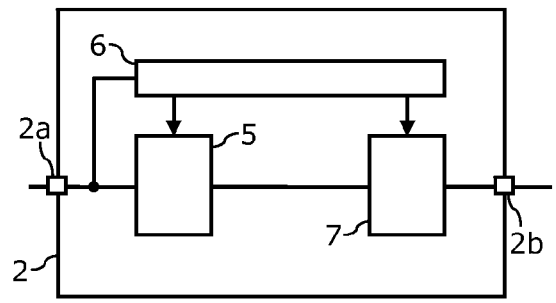
FIG. 3 schematically shows an example of an embodiment of a control device for recovering NBTI/PBTI related parameter degradation in MOSFET devices.

As exemplarily shown in FIG. 3, a control device 2 of the integrated circuit 1 of FIG. 2 may be implemented as the control device 2 for recovering NBTI/PBTI related parameter degradation in a MOSFET device of FIG. 3. The control device 2 may comprise an output 2b, a driver module 7 coupled to the output 2b, a control module 5 coupled to the driver module 7, an input 2a coupled to the control module 5, and a timing module 6 coupled to the input 2a, the control module 5 and the driver module 7.

The driver module 7 may be configured to provide a gate driver signal to the gate of a MOSFET device 3 or 4 operably connected to the output 2b of the control device 2. This gate driver signal may be generated on the basis of a gate control signal which may be provided by the control module 5 for controlling the switching or toggling function of the MOSFET device 3 or 4. The control device 2 may receive an operation activation signal for the MOSFET device(s) by way of the input 2a, for example from a central processing unit (not shown).

The operation activation signal may be input to the timing module 6 which may be configured to output a first activation signal to the driver module 7 which causes the driver module 7 to hold the MOSFET device(s) 3 and/or 4 in an active state for a predetermined time span after receiving the first activation signal. In that sense, active state may mean to reduce the bias of the gate voltage of the MOSFET device 3 or 4 with respect to the drain or source voltage at least partially for the predetermined time span. This is in particular the case, when the operation activation signal is issued after a standby mode of the MOSFET device(s) 3 or 4, i.e. a mode in which the gate of the MOSFET device(s) has been continuously kept biased with respect to the drain or source voltage for a prolonged period of time.

The first activation signal is intended to allow the functional parameters P(t) of the MOSFET device(s) 3 or 4 to recover at least partially during the predetermined time span. The predetermined time span may for example have a duration between 1 ns to 1 ms, particularly 10 ns to 500 ns, and may be set according to the timing requirements, the desired decrease of design margins or the type of MOSFET device. After the predetermined time span has elapsed the timing module 6 may be configured to output a second activation signal to the control module 5. The second activation signal may cause the control module 5 to generate gate control signals according to a normally intended operational mode of the at least one MOSFET device(s) 3 or 4, i.e. second activation signal is intended to indicate to the control module 5 that the MOSFET device(s) 3 or 4 have "warmed up" and are ready to be used for their desired functionality within the integrated circuit.

The timing module 6 may be implemented as a software routine within the control device 2.

It may for example also be possible to implement the functionality of the timing module 6 within the driver module 7 as hardware coded delay elements. The predetermined time span may be adjustable for the timing module 6.

Figure 4:
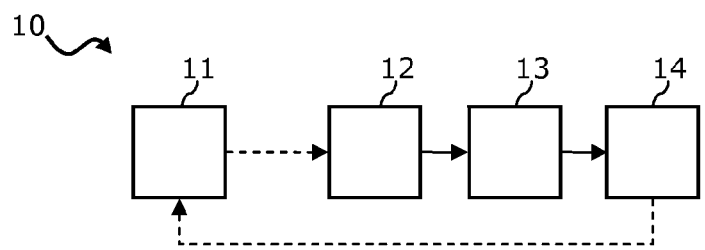
FIG. 4 schematically shows an example of an embodiment of a method for recovering NBTI/PBTI related parameter degradation in MOSFET devices.

FIG. 4 schematically illustrates a method 10 for recovering NBTI/PBTI related parameter degradation in a MOSFET device, such as the MOSFET devices as shown in conjunction with FIGS. 2 and 3. The method 10 may advantageously be implemented by using a control device such as the control device 2 in FIGS. 2 and 3. The method 10 may comprise as illustrated with block 11 an operating of a MOSFET device in a standby mode. This may involve continuously keeping the gate voltage of the MOSFET device biased with respect to the drain or source voltage. As illustrated with block 12, when the MOSFET device is intended to be used in a "normal" or active operation mode, the MOSFET device may be exited from the standby mode. After exiting the MOSFET device from the standby mode, the MOSFET device may as illustrated with block 13 be held in an active state for a predetermined time span. The predetermined time span may have a duration of 1 ns to 1 ms, particularly 10 ns to 500 ns. During the predetermined time span the bias of the gate voltage of the MOSFET device may at least partially be reduced with respect to the drain or source voltage, in order to recover NBTI/PBTI induced degradation of functional parameters of the MOSFET device, such as the threshold voltage. Finally, as illustrated with block 14, the MOSFET device may be operated in an operational mode after the predetermined time span has elapsed. The operational mode may for example comprise toggling the MOSFET device according to its intended function, for example within an integrated circuit.

The method 10 may be applied to n-channel MOSFET devices 3 and/or p-channel MOSFET devices 4. The method 10 may iterate when the operational mode is to be finished and the MOSFET devices is put into a standby mode again.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections.

Because the apparatus implementing the present invention is, for the most part, composed of electronic components and circuits known to those skilled in the art, details of the circuitry and its components will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different FET devices and circuitry components. For example, the exemplary topology in the figures and the discussion thereof is presented merely to provide a useful reference in discussing various aspects of the invention. Of course, the description of the topology has been simplified for purposes of discussion, and it is just one of many different types of appropriate topologies that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. Devices functionally forming separate devices may be integrated in a single physical device.

In the claims, any reference signs placed between parentheses shall not be construed as limiting the claim. The word "comprising" does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage. The order of method steps as presented in a claim does not prejudice the order in which the steps may actually be carried, unless specifically recited in the claim.

The invention claimed is:

1. A method for recovering NBTI/PBTI related parameter degradation in at least one MOSFET device, comprising:
operating the at least one MOSFET device in a standby mode;
exiting the at least one MOSFET device from the standby mode;
holding the at least one MOSFET device in an active state for a predetermined time span after exiting the standby mode; and
operating the at least one MOSFET device in an operational mode after the predetermined time span has elapsed.

2. The method of claim 1, wherein the at least one MOSFET device comprises at least one n-channel MOSFET device or at least one p-channel MOSFET device.

3. The method of claim 2, wherein the at least one MOSFET device comprises at least one n-channel MOSFET device and at least one p-channel MOSFET device.

4. The method of one of claim 1, wherein the operating the at least one MOSFET device in a standby mode comprises continuously keeping the gate voltage of the at least one MOSFET device biased with respect to the drain or source voltage of the at least one MOSFET device.

5. The method of claim 4, wherein the holding the at least one MOSFET device in an active state comprises reducing the bias of the gate voltage of the at least one MOSFET device with respect to the drain or source voltage of the at least one MOSFET device at least partially for the predetermined time span.

6. The method of claim 1, wherein the predetermined time span has a duration of 1 ns to 1 ms.

7. The method of claim 1, wherein the predetermined time span has a duration of 10 ns to 500 ns.

8. The method of claim 1, wherein the operational mode comprises toggling the at least one MOSFET device according to its intended function.

9. A control device for recovering NBTI/PBTI related parameter degradation in at least one MOSFET device, comprising:
an output configured to be operably connected to the at least one MOSFET device;
a driver module coupled to the output and configured to provide a gate driver signal to the gate of the at least one MOSFET device;
a control module coupled to the driver module and configured to input a gate control signal for the at least one MOSFET device to the driver module;
an input configured to receive an operation activation signal for the at least one MOSFET device; and
a timing module coupled to the input, the control module and the driver module, the timing module configured to receive the operation activation signal, to output a first activation signal to the driver module causing the driver module to hold the at least one MOSFET device in an active state for a predetermined time span after receiving the first activation signal, and to output a second activation signal to the control module causing the control module to generate gate control signals according to an operational mode of the at least one MOSFET device after the predetermined time span has elapsed.

10. The control device of claim 9, wherein the timing module is configured to output the first activation signal after the gate voltage of the at least one MOSFET device has been continuously kept biased with respect to the drain or source voltage of the at least one MOSFET device.

11. The control device of claim 10, wherein the first activation signal causes the driver module output the gate driver signal to reduce the bias of the gate voltage of the at least one MOSFET device with respect to the drain or source voltage of the at least one MOSFET device at least partially for the predetermined time span.

12. The control device of claim 9, wherein the predetermined time span has a duration of 1 ns to 1 ms.

13. The method of claim 9, wherein the predetermined time span has a duration of 10 ns to 500 ns.

14. An integrated circuit, comprising:
the control device of claim 9; and
at least one MOSFET device operably connected to the output of the control device.

15. The integrated circuit of claim 14, wherein the at least one MOSFET device comprises at least one n-channel MOSFET device or at least one p-channel MOSFET device.

16. The method of claim 15, wherein the at least one MOSFET device comprises at least one n-channel MOSFET device and at least one p-channel MOSFET device.

* * * * *